United States Patent
Sung et al.

(10) Patent No.: US 7,214,564 B2
(45) Date of Patent: May 8, 2007

(54) METHOD OF FORMING FILM BULK ACOUSTIC WAVE FILTER ASSEMBLY

(75) Inventors: Po-Hsun Sung, Longtan Township, Taoyuan County (TW); Pei-Yen Chen, Longtan Township, Taoyuan County (TW); Yung-Chung Chin, Longtan Township, Taoyuan County (TW); Pei-Zen Chang, Longtan Township, Taoyuan County (TW); Yen-Ming Pang, Longtan Township, Taoyuan County (TW); Chi-Ming Fang, Longtan Township, Taoyuan County (TW); Chun-Li Hou, Longtan Township, Taoyuan County (TW)

(73) Assignee: Chung Shan Institute of Science and Technology, Taoyuan County (TW)

( * ) Notice: Subject to any disclaimer, the term of this patent is extended or adjusted under 35 U.S.C. 154(b) by 106 days.

(21) Appl. No.: 11/081,623

(22) Filed: Mar. 17, 2005

(65) Prior Publication Data
US 2006/0208833 A1    Sep. 21, 2006

(51) Int. Cl.
*H01L 23/52* (2006.01)
(52) U.S. Cl. .................. 438/107; 438/31; 438/50; 438/53; 438/109; 438/110; 438/956
(58) Field of Classification Search ............ 438/31, 438/50, 53, 107, 109, 110, 956, FOR. 143
See application file for complete search history.

(56) References Cited

U.S. PATENT DOCUMENTS

| | | | |
|---|---|---|---|
| 5,075,641 A | 12/1991 | Weber et al. | |
| 5,166,646 A | 11/1992 | Avanic et al. | |
| 5,260,596 A | 11/1993 | Dunn et al. | |
| 6,285,866 B1 | 9/2001 | Lee et al. | |
| 6,617,249 B2 | 9/2003 | Ruby et al. | |
| 2005/0035420 A1* | 2/2005 | Ma et al. | 257/414 |
| 2005/0104204 A1* | 5/2005 | Kawakubo et al. | 257/724 |
| 2005/0224900 A1* | 10/2005 | Ginsburg et al. | 257/415 |
| 2006/0012021 A1* | 1/2006 | Larson et al. | 257/686 |

OTHER PUBLICATIONS

Hsun et al., An innovative frequency-trimming technique for manufacturing FBAR.
Sung et al. The Method for Intergrating FBAR with circuitry on CMOS chip.

* cited by examiner

*Primary Examiner*—George R. Fourson
*Assistant Examiner*—Joannie Adelle Garcia
(74) *Attorney, Agent, or Firm*—Rabin & Berdo, P.C.

(57) ABSTRACT

A film bulk acoustic wave filter assembly includes a film bulk acoustic filter and an RF circuit. The film bulk acoustic filter unit cell includes a plurality of film bulk acoustic wave resonators. The number, area and arrangement of the resonators depend on the characteristics of the filter. In the film bulk acoustic wave filter, a metal layer made by CMOS processes is used as a lower electrode area of the film bulk acoustic wave filter or a suspended chamber. The film bulk acoustic filter can be integrated with the RF circuit using processes such as the CMOS process. It facilitates the integration of active devices, streamlining of system design and simplification of test processes, and has a great influence on the application of RF communication devices and integration of system-system-chip (SOC).

11 Claims, 5 Drawing Sheets

METHOD OF FORMING FILM BULK ACOUSTIC WAVE FILTER ASSEMBLY

BACKGROUND OF THE IVENTION

1. Field of the Invention

This invention relates to a film bulk acoustic wave filter assembly, and more particularly to a film bulk acoustic wave filter assembly that can be applied in the integration of high-frequency circuit design and SOC.

2. Related Art

RF micro devices are key aspects of the development of wireless communication. Communication passive devices such as duplexers, filters and power amplifiers need to be combined with an RF circuit individually. The wiring parts of the connection between the passive devices and the RF circuit generate parasitic effects due to RF signals, thereby increasing complexity in system integration. For example, U.S. Pat. No. 6,285,866 published on Sep. 4, 2001, discloses high-frequency passive devices and other active/passive devices that are integrated on a single chip to streamline system design and simplify test processes. According to the disclosure a thin or thick piezoelectric crystal wafer is bonded on a silicon substrate. Specifically, a silicon chip having active devices thereon is bonded to a piezoelectric chip. However, in the invention, a film bulk acoustic wave resonator is integrated with a semiconductor integrated circuit (IC) in a compatible semiconductor process.

SUMMARY OF THE INVENTION

An object of the invention is therefore to provide a film bulk acoustic wave filter assembly in which a film bulk acoustic wave filter is integrated with an RF circuit as a single chip so that the filter or a duplexer can be designed with circuit design simultaneously. In the invention, less than 2 μm thick piezoelectric film is grown on a silicon chip having active devices thereon, without any need of a piezoelectric chip. Passive device production can be integrated with the semiconductor process of forming a silicon chip having active devices thereon so as to form a suspended piezoelectric film. The piezoelectric film is first grown directly on an integrated circuit silicon chip at a temperature in the tolerable range of the circuit. An under-metal sacrificed layer is then etched off to form the suspended piezoelectric film. Replacement of semiconductor metal is further performed to grow a lower electrode and increase the characteristics of the resonator. Thereby, the simulation design is completed and system integration is less complicated, which has a great influence on integration of active/passive devices and SOC chip production.

DETAILED DESCRIPTION OF THE PREFERRED EMBODIMENTS

Figure 1:
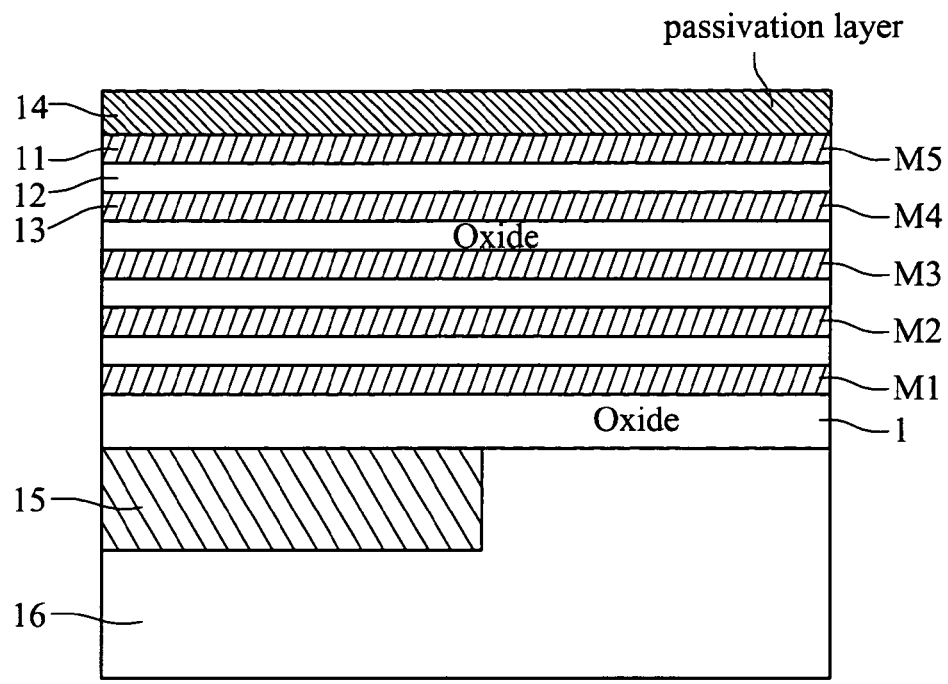
FIG. 1 is a cross-sectional view of an IC chip obtained from CMOS standard processes.
Figure 2:
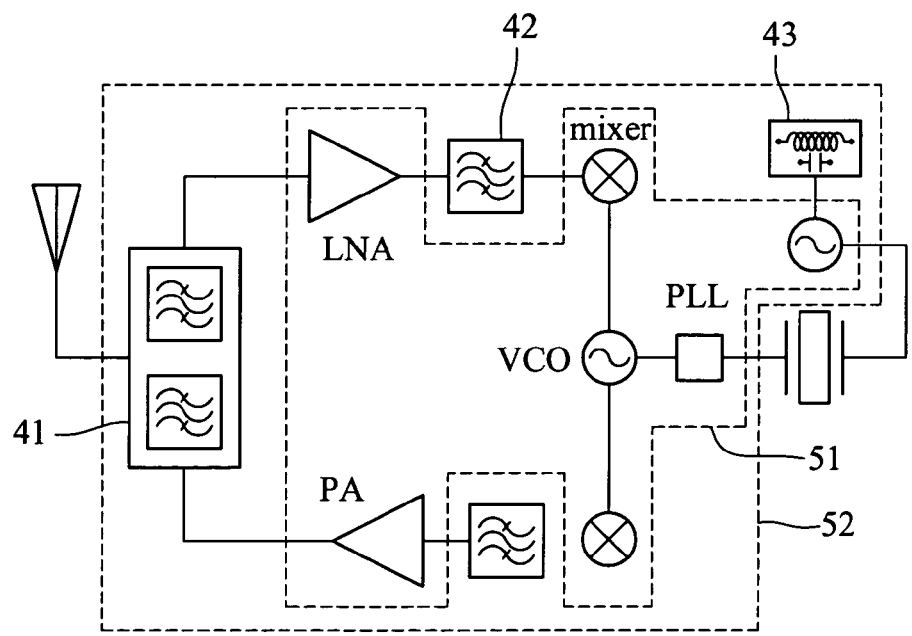
FIG. 2 is a schematic view showing part of the RF circuit region and part of the RF integrated chip of the invention.

FIG. 1 is a cross-sectional view of an IC chip obtained from CMOS standard processes. FIG. 2 is a schematic view showing part of the RF circuit region and part of the RF integrated chip of the invention.

Referring to FIG. 1, there are passivation layer 14, first metal layer 11, first silicon oxide layer 12 and second metal layer 13 successively above the IC chip.

Referring to FIG. 2, the front end module of conventional CMOS RF integrated circuit includes a low noise amplifier (LNA), a mixer, a voltage control oscillator (VCO) and a phase loop lock, which are able to be integrated on single chip at the beginning of the circuit design. Through the invention, passive devices that used to be produced individually in the art, such as a film bulk acoustic wave duplexer 41, film bulk acoustic filter 42 and film bulk acoustic wave resonator 43, can be produced integrally with an RF active circuit region 51 by a standard process and a silicon micro-electro-mechanical post process. Reference number 52 indicates an area covered by an integrated chip.

Figure 3:
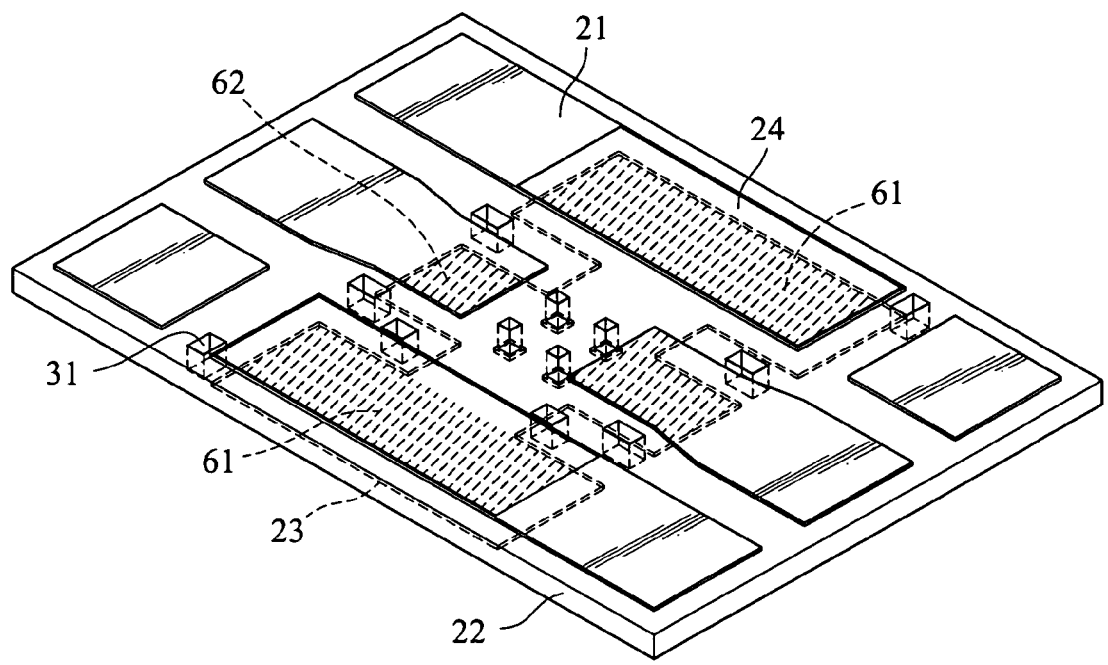
FIG. 3 shows the 3D structure of the film bulk acoustic wave filter.

FIG. 3 shows the process of forming a film bulk acoustic wave filter by a standard CMOS process according to one embodiment of the invention. From up to down, there are upper electrode metal layer 21, piezoelectric material layer 22, lower electrode metal layer 23, and a frequency modulation layer 24 of the shunt resonator of the film bulk acoustic wave filter. The equivalent circuit is a film bulk acoustic wave filter in the FIG. 4, which is composed of two shunt resonators 61 and two series resonators 62.

Figure 4:
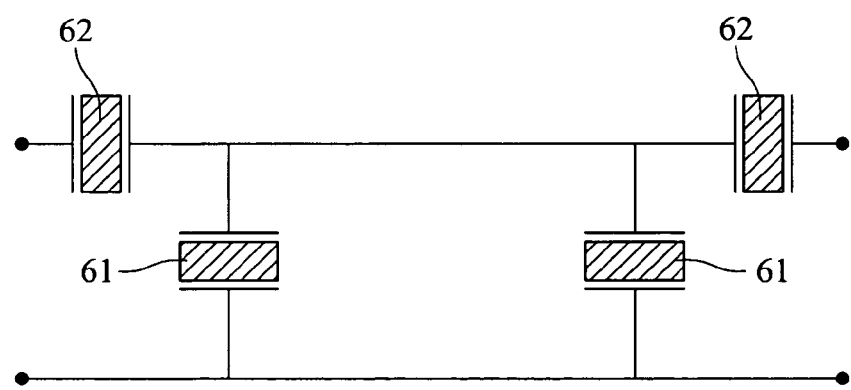
FIG. 4 shows the layout of a Ladder-type film bulk acoustic wave filter.
Figure 5A:
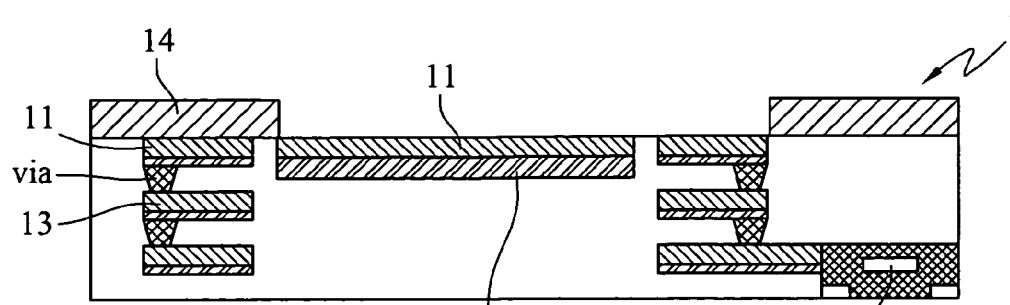
FIG. 5A to FIG. 5D are cross-sectional schematic views showing the process of integrating a film bulk acoustic wave filter with an RF communication circuit on a chip.
Figure 5B:
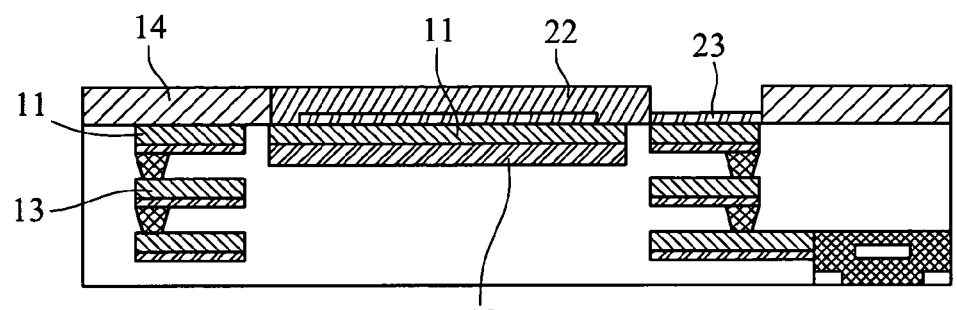
Figure 5C:
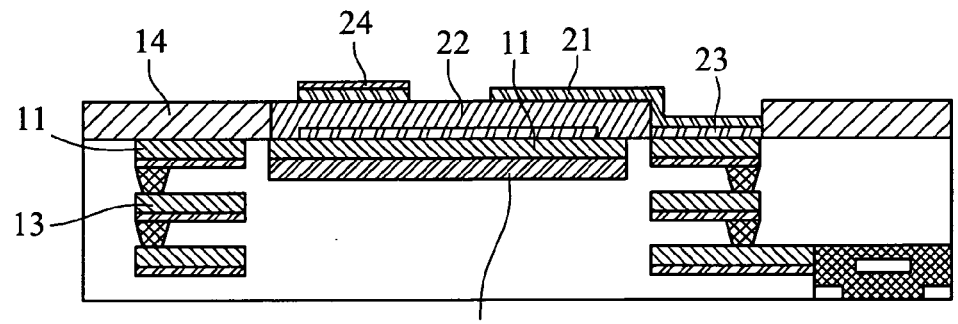
Figure 5D:
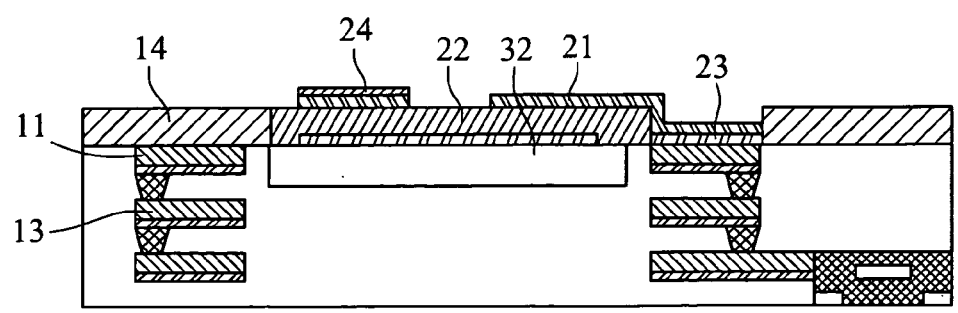
Figure 6A:
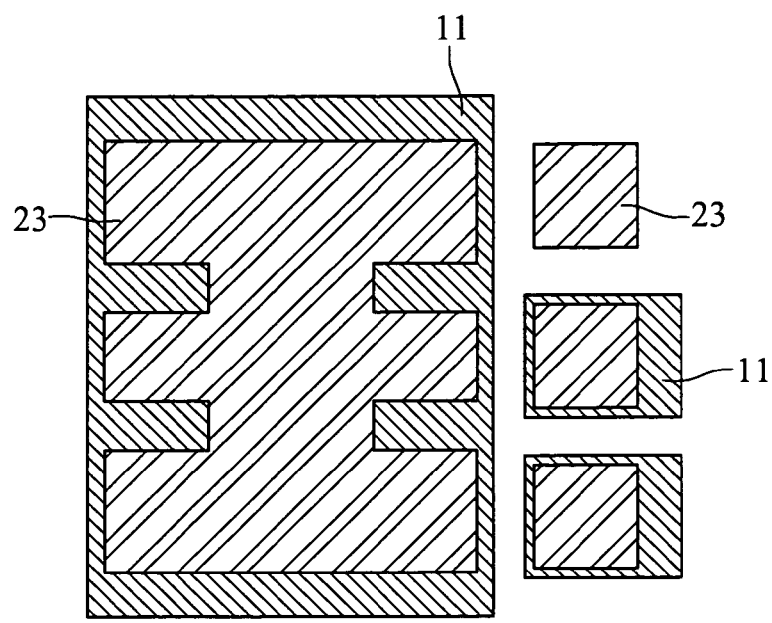
FIG. 6A to FIG. 6D are top schematic views showing the process of integrating a film bulk acoustic wave filter with an RF communication circuit on a chip.
Figure 6B:
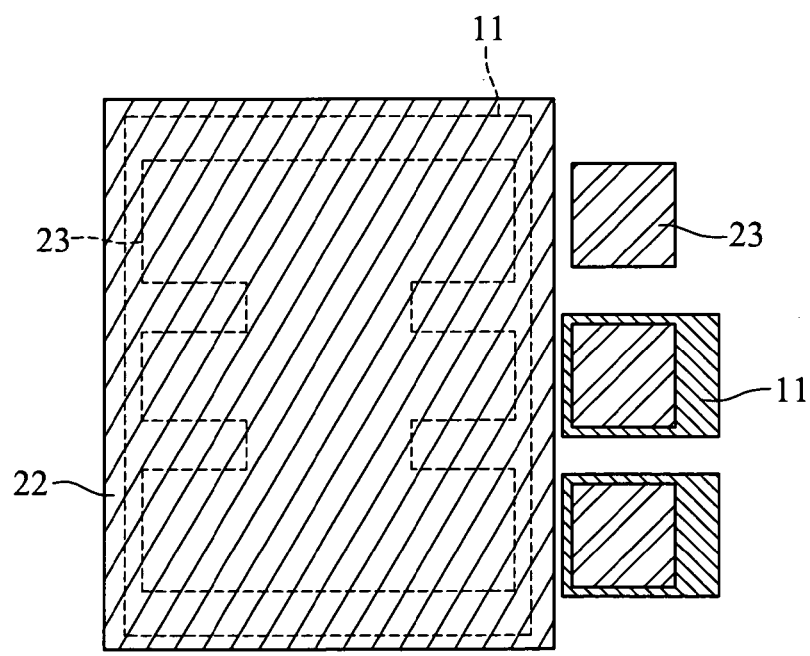
Figure 6C:
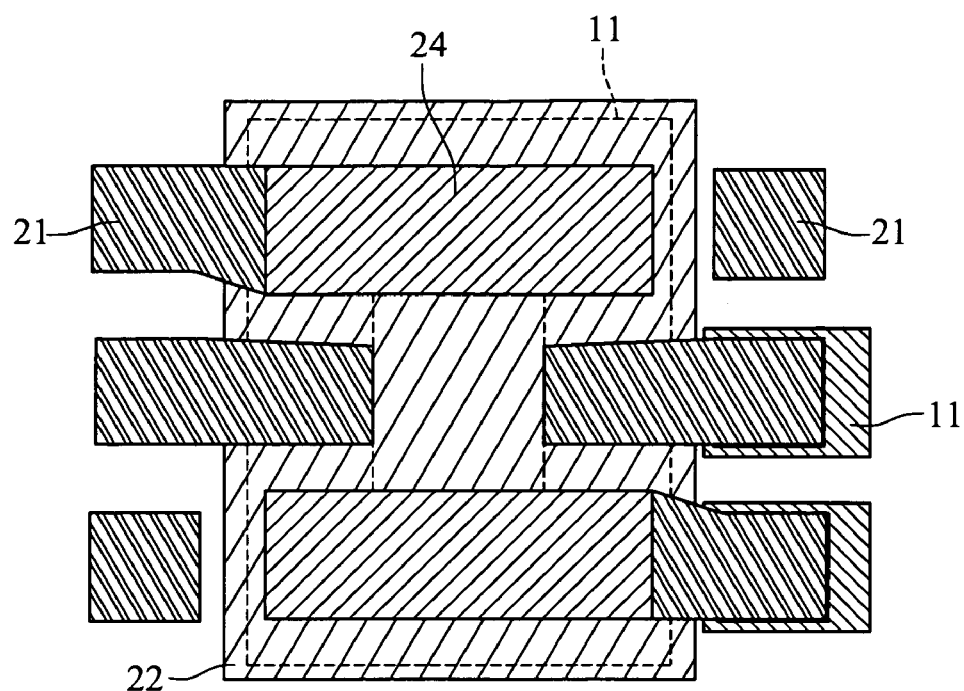
Figure 6D:
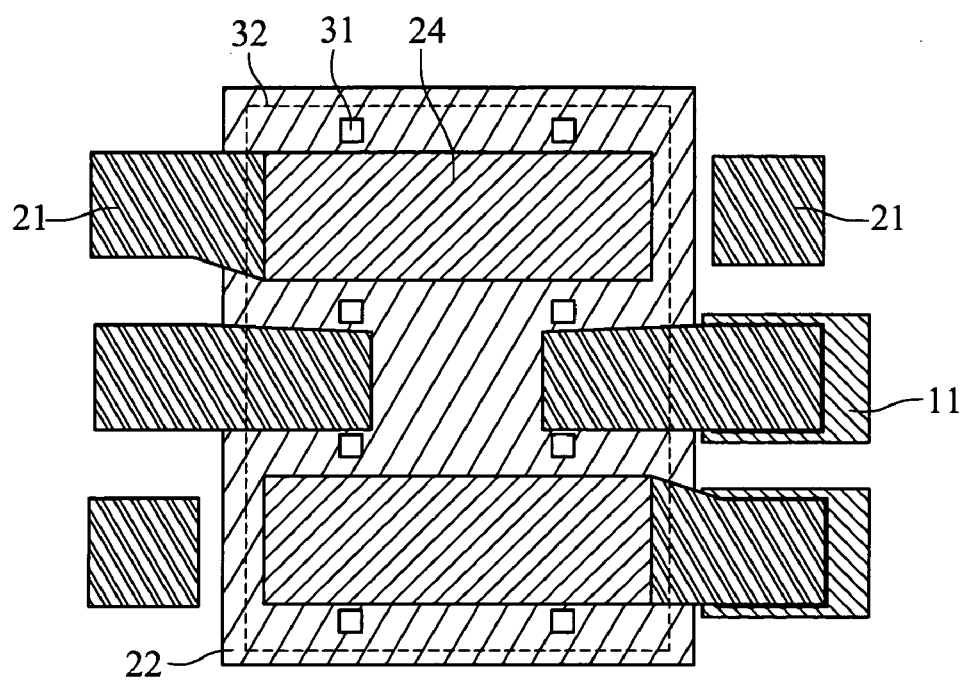

FIG. 4 shows the layout of a filter used in the invention. The filter can be, for example, a Ladder-type bulk acoustic wave filter. The main purposes of such a design are to prevent the use of electrode channels, reduce structural complexity, make the contacts of the input and output equally high, and measurement easy to implement.

FIG. 5A to FIG. 5D are cross-sectional schematic views showing the process of integrating a film bulk acoustic wave filter with an RF communication circuit on a chip. An IC chip 1 produced by a standard CMOS process is provided. Part of the passivation layer 14 on the chip is removed during the CMOS process. Using the topmost metal layer 11 and second metal layer 13 as a sacrificed layer for etching for a chamber region and the micro manufacturing technique of the surface. A lower electrode layer 23 of the film bulk acoustic wave filter is formed on the topmost metal layer 11 using the CMOS process. The material for the lower electrode 23 must have good etching selectivity with proper lattices in order for the piezoelectric layer 22 to exhibit appropriate lattice direction and good piezoelectric properties. An upper electrode layer 21 is grown on the piezoelectric layer 22. Since the working bandwidth is important to the wave filter, it is necessary to form a frequency modulation metal layer 24 at the parallel connection site of the resonator to meet bandwidth requirements. The thickness of the frequency modulation metal layer has an upper-limit value due to the characteristics of the wave filter. The topmost metal layer 11 is wet etched through an etching hole 31 by wet etching to form a chamber region where the film bulk acoustic wave filter is suspended. The film bulk acoustic wave filter connects to the topmost metal layer 11 at the RF circuit site via the upper electrode layer 21. Thereby, signals are introduced to the circuit site.

FIG. 6A to FIG. 6D are top schematic views showing the process of integrating a film bulk acoustic wave filter with an RF communication circuit on a chip. When design the RF circuit on the silicon wafer in front end, define the top most metal region 11 of the CMOS standard process. A film bulk acoustic wave filter is manufactured based on the region. Use several post process mask to define a lower electrode metal layer 23, piezoelectric material layer 22, upper electrode metal layer 21, a frequency modulation layer 24 and a etching hole 31, which is co-operated with the standard depositing and etching CMOS process to complete a suspending structure of a empty chamber 32. Therefore the film bulk acoustic wave filter is able to combine with the RF active circuit on the same chip.

As described above, the film bulk acoustic wave filter and the RF communication circuit are integrated according to the invention. It will be apparent to the person skilled in the art that the invention as described above may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a plurality of film bulk wave resonators and assembling them into a film bulk acoustic wave filter by a standard process, comprising:
    a) providing a semiconductor substrate having a topmost metal layer;
    b) defining a suspension chamber region for the film bulk wave resonators;
    c) providing a lower electrode layer for the film bulk wave resonators on the topmost metal layer by a standard CMOS process;
    d) providing a piezoelectric layer on the lower electrode layer;
    e) providing an upper electrode layer on the piezoelectric layer; and
    f) etching the topmost metal layer through an etching hole by a CMOS standard process to form the suspension chamber region defined in step b) and thereby suspend the film bulk wave resonators on the substrate.

2. The method of claim 1, wherein the topmost metal layer is used as a sacrificed layer during the etching of step f).

3. The method of claim 1, wherein the topmost metal layer includes all kinds of metals used in various CMOS processes.

4. The method of claim 1, wherein the lower and upper electrodes of the film bulk acoustic wave filter are made of a material that has good etching selectivity with respect to the topmost metal layer.

5. The method of claim 1, wherein the piezoelectric layer of the film bulk acoustic wave filter is made of a material that has good etching selectivity with respect to the topmost metal layer.

6. A method of forming a film bulk acoustic wave filter by a standard process, the method comprising: forming a plurality of film bulk wave resonators; and
    assembling the film bulk wave resonators into the film bulk acoustic wave filter,
    wherein the step of assembling the film bulk wave resonators into a film bulk acoustic wave filter comprises:
        a) selecting proper film bulk wave resonators as a unit of filter;
        b) correspondingly connecting an upper electrode layer to a lower electrode layer to assemble the film bulk wave resonators as a unit cell;
        c) defining an area of each film bulk wave resonator and a thickness of each film to provide the filter with required characteristics, wherein the lower electrode layer and a piezoelectric layer of each resonator have the same thickness; and
        d) increasing the film thickness at parallel sites to increase filter performance and a required bandwidth.

7. The method of claim 6, wherein a suspension chamber region is formed by, using a standard CMOS process, etching a topmost metal layer that is used as a sacrificed layer.

8. The method of claim 7, wherein the suspension chamber region suspends any kind of film bulk wave resonators.

9. The method of claim 6, wherein the lower electrode layer connects to two resonators in series and to one resonator in parallel to form the unit cell.

10. The method of claim 6, wherein the upper electrode layer connects to input/output ports of the resonators and electrodes that introduce to an RF communication circuit.

11. The method of claim 9, wherein a frequency modulation metal layer is connected to the upper electrode layer.

* * * * *